(12) United States Patent
Krause et al.

(10) Patent No.: US 8,324,732 B2
(45) Date of Patent: Dec. 4, 2012

(54) SEMICONDUCTOR COMPONENT

(75) Inventors: Andreas Krause, Dresden (DE); Bernd Bitnar, Freiberg (DE); Holger Neuhaus, Freiberg (DE); Martin Kutzer, Penig (DE); Kristian Schlegel, Zwickau (DE); Claudia Lengsfeld, Freiberg (DE)

(73) Assignee: Deutsche Cell GmbH, Freiberg (DE)

( * ) Notice: Subject to any disclaimer, the term of this patent is extended or adjusted under 35 U.S.C. 154(b) by 459 days.

(21) Appl. No.: 12/537,450

(22) Filed: Aug. 7, 2009

(65) Prior Publication Data

US 2010/0032013 A1 Feb. 11, 2010

(30) Foreign Application Priority Data

Aug. 8, 2008 (DE) .................. 10 2008 037 033
Dec. 16, 2008 (DE) .................. 10 2008 062 591

(51) Int. Cl.
*H01L 23/48* (2006.01)

(52) U.S. Cl. . 257/773; 257/775; 257/774; 257/E21.575; 257/E23.011; 136/256; 438/666; 438/98

(58) Field of Classification Search .......... 257/773–775; 136/256

See application file for complete search history.

(56) References Cited

U.S. PATENT DOCUMENTS

2009/0050202 A1* 2/2009 Du et al. ................ 136/261
2009/0211628 A1* 8/2009 Engelhart et al. ......... 136/256
2010/0084009 A1* 4/2010 Carlson et al. ............ 136/255
2010/0193002 A1* 8/2010 Dimroth et al. ........... 136/206

FOREIGN PATENT DOCUMENTS

DE 102008024053 5/2008
DE 102008031836 7/2008

* cited by examiner

*Primary Examiner* — Julio J Maldonado
*Assistant Examiner* — Mamadou Diallo
(74) *Attorney, Agent, or Firm* — McGlew and Tuttle, P.C.

(57) ABSTRACT

A semiconductor component, in particular in the form of a solar cell, comprises a two-dimensional semiconductor substrate with a first side, a second side which is arranged opposite thereto, a surface normal which is perpendicular to said first and second sides, and a plurality of recesses which are at least arranged on the second side and extend in the direction of the surface normal, at least one dielectric passivation layer which is arranged on the second side, an electrically conducting contact layer arranged on the passivation layer, a plurality of contact elements for electrically connecting the contact layer with the semiconductor substrate, which contact elements are electrically conductive, are in electrically conducting connection with both the semiconductor substrate and with the contact layer, fill at least 50%, in particular at least 90%, preferably 100% of in each case one of the recesses, project beyond the recesses with a projection in the direction perpendicular to the surface normal and are of an easily solderable material.

12 Claims, 7 Drawing Sheets

SEMICONDUCTOR COMPONENT

BACKGROUND OF THE INVENTION

1. Field of the Invention

The invention relates to a semiconductor component and to a method for the production of a semiconductor component.

2. Background Art

Laser fired contact (LFC) solar cells are usually provided with a metal layer of aluminum on the back side of the solar cell facing away from the sun. It is known that the soldering of aluminum requires an extreme amount of technical effort. A galvanic deposition of an easily solderable metal layer on the aluminum layer is rather difficult as the aluminum layer spontaneously forms an aluminum oxide surface layer which is not able to conduct electrons. A galvanic coating of the back side of an LFC solar cell is therefore impossible without a special pretreatment. Pretreatments of this type are complex and expensive. Furthermore, they reduce the bonding strength of the deposited layers.

SUMMARY OF THE INVENTION

It is therefore the object of the invention to provide a semiconductor component having an improved contact layer. It is another object of the invention to provide a method for the production of a semiconductor component of this type.

This object is achieved according to the invention by a semiconductor component, in particular in the form of a solar cell, comprising a two-dimensional semiconductor substrate having a first side, a second side arranged opposite to said first side, a surface normal which is perpendicular to said first and second sides, and a plurality of recesses which are at least arranged on the second side and extend in the direction of the surface normal, at least one dielectric passivation layer arranged on the second side, an electrically conducting contact layer arranged on the passivation layer, a plurality of contact elements for electrically connecting the contact layer with the semiconductor substrate, which contact elements are electrically conductive, are in electrically conducting connection with both the semiconductor substrate and with the contact layer, fill at least 50%, in particular 90%, in particular 100% of at least one of the recesses, project beyond the recesses with a projection in the direction perpendicular to the surface normal, and are of an easily solderable material.

This object is further achieved by a method for the production of a semiconductor component, the method comprising the steps of providing a two-dimensional semiconductor substrate having a first side, a second side, a surface normal which is perpendicular to said first and second sides, at least one electrically insulating, first passivation layer which is arranged on the second side, and at least one contact layer arranged on the passivation layer, forming recesses by means of a laser, the recesses extending into the semiconductor substrate through the first passivation layer, and filling the recesses by means of galvanic deposition of contact elements.

The gist of the invention is to fill the recesses, which have been formed on the surface of a semiconductor substrate by means of a laser, with contacts that are deposited galvanically. Advantageously, the recesses are arranged in at least one portion of the surface of the semiconductor substrate in such a way that adjacent contacts melt together such as to form a coherent contact structure.

Features and details of the invention will become apparent from the description of several embodiments by means of the drawings.

DESCRIPTION OF THE PREFERRED EMBODIMENTS

Figure 1:
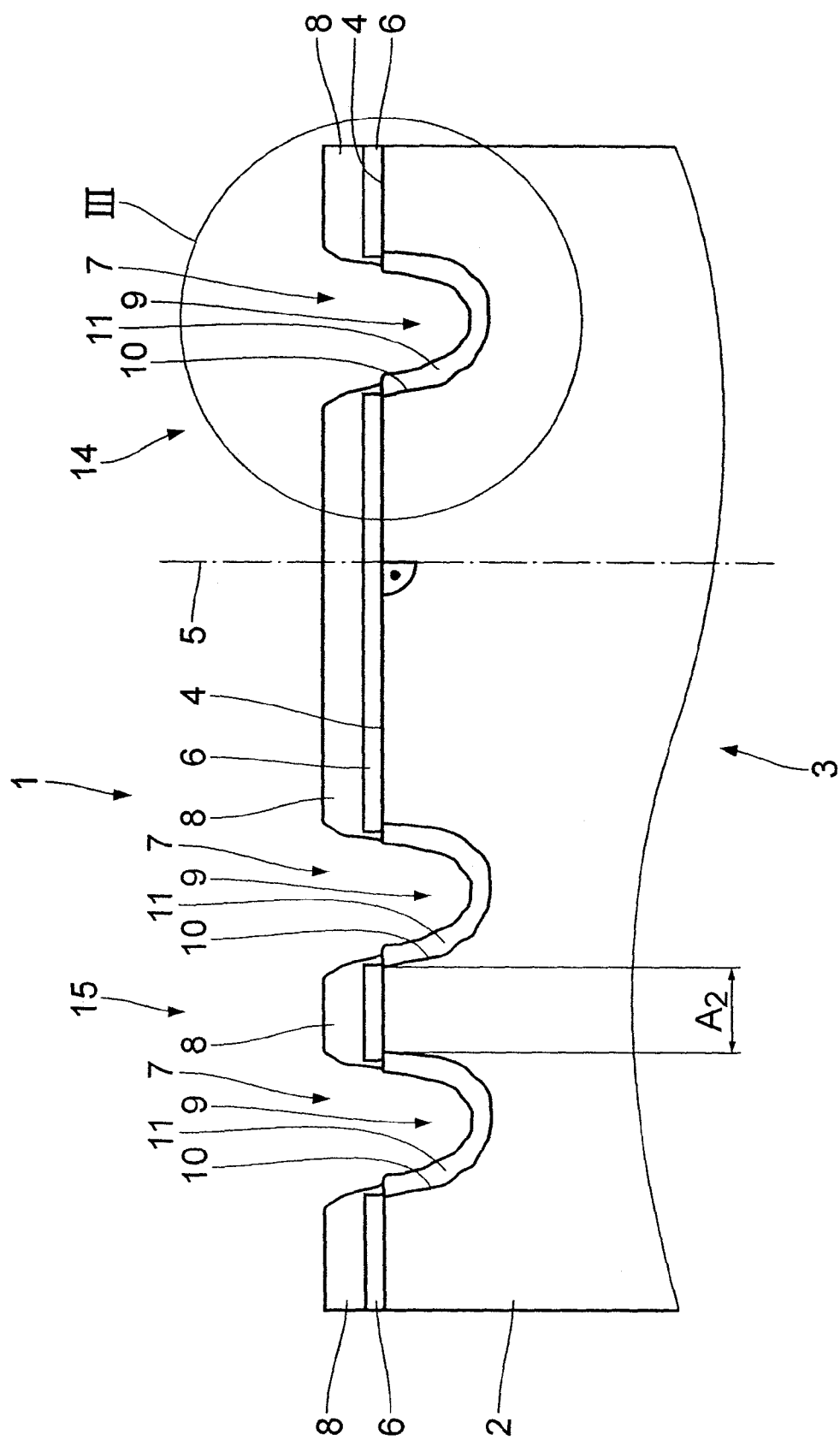
FIG. 1 is a cross-section through a semiconductor component according to an embodiment prior to filling the LFC contacts.
Figure 2:
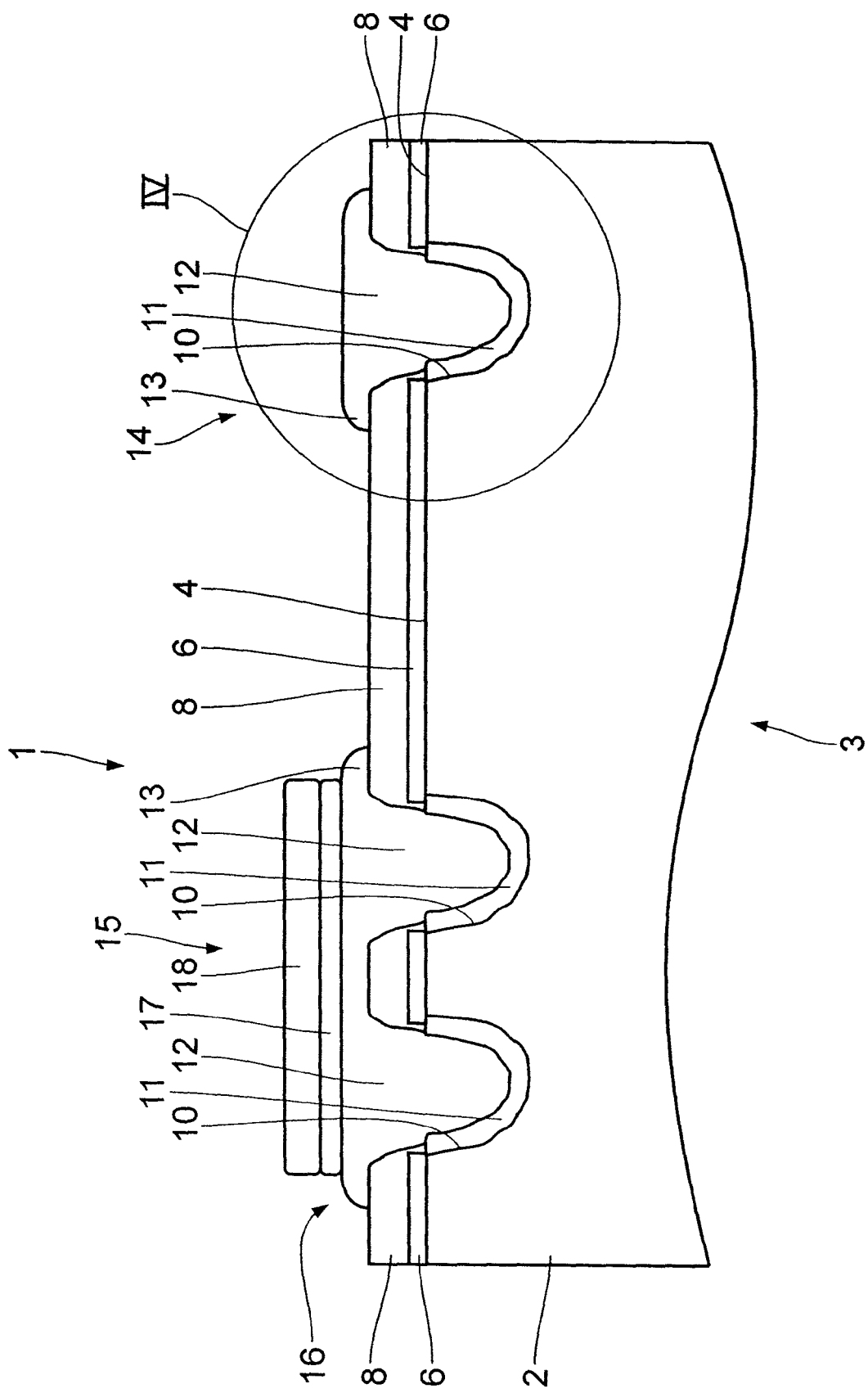
FIG. 2 is a cross-section through the semiconductor component according to FIG. 1 after soldering the contacts.
Figure 3:
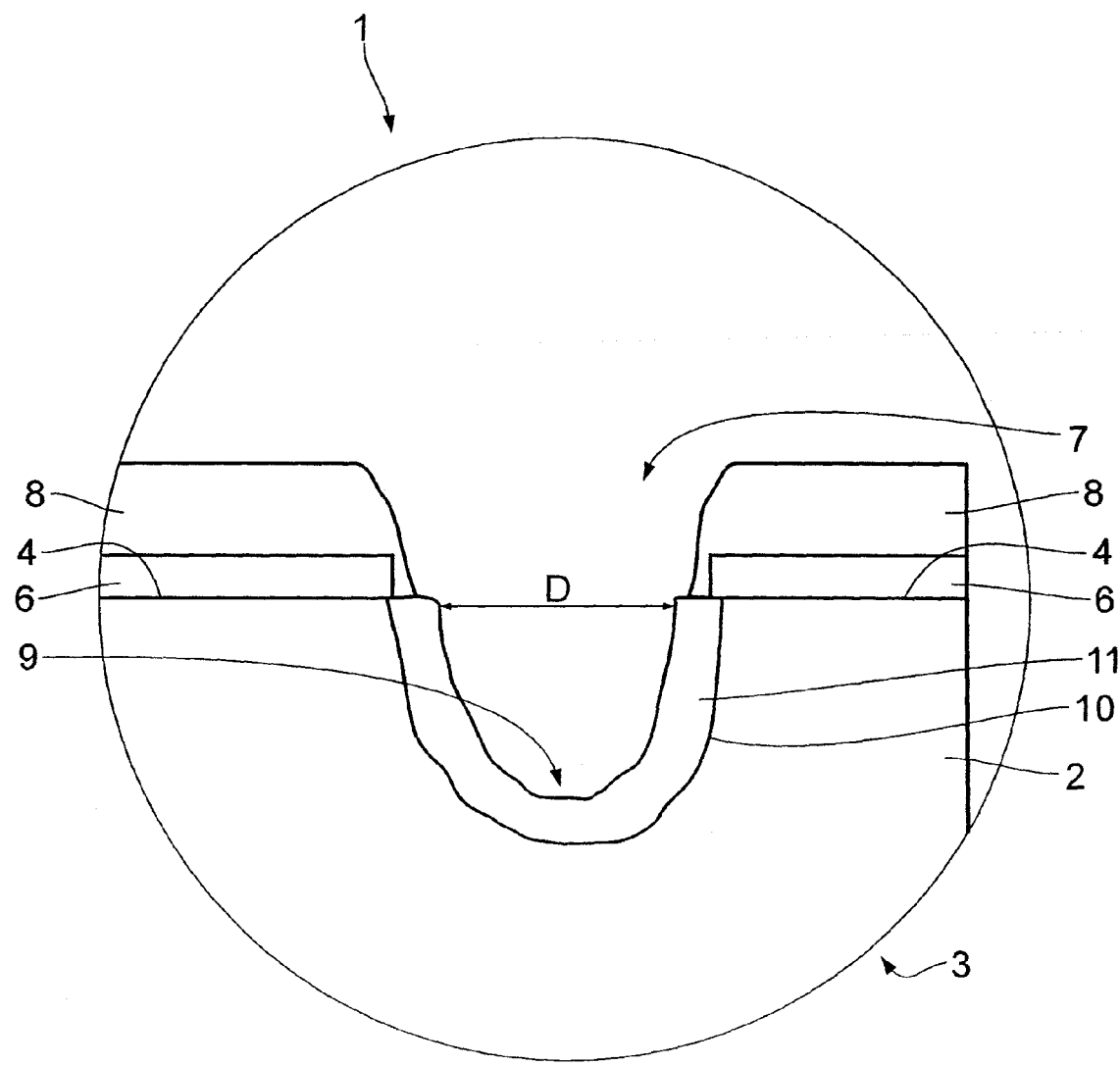
FIG. 3 is an enlarged sectional view of the region III in FIG. 1.
Figure 4:
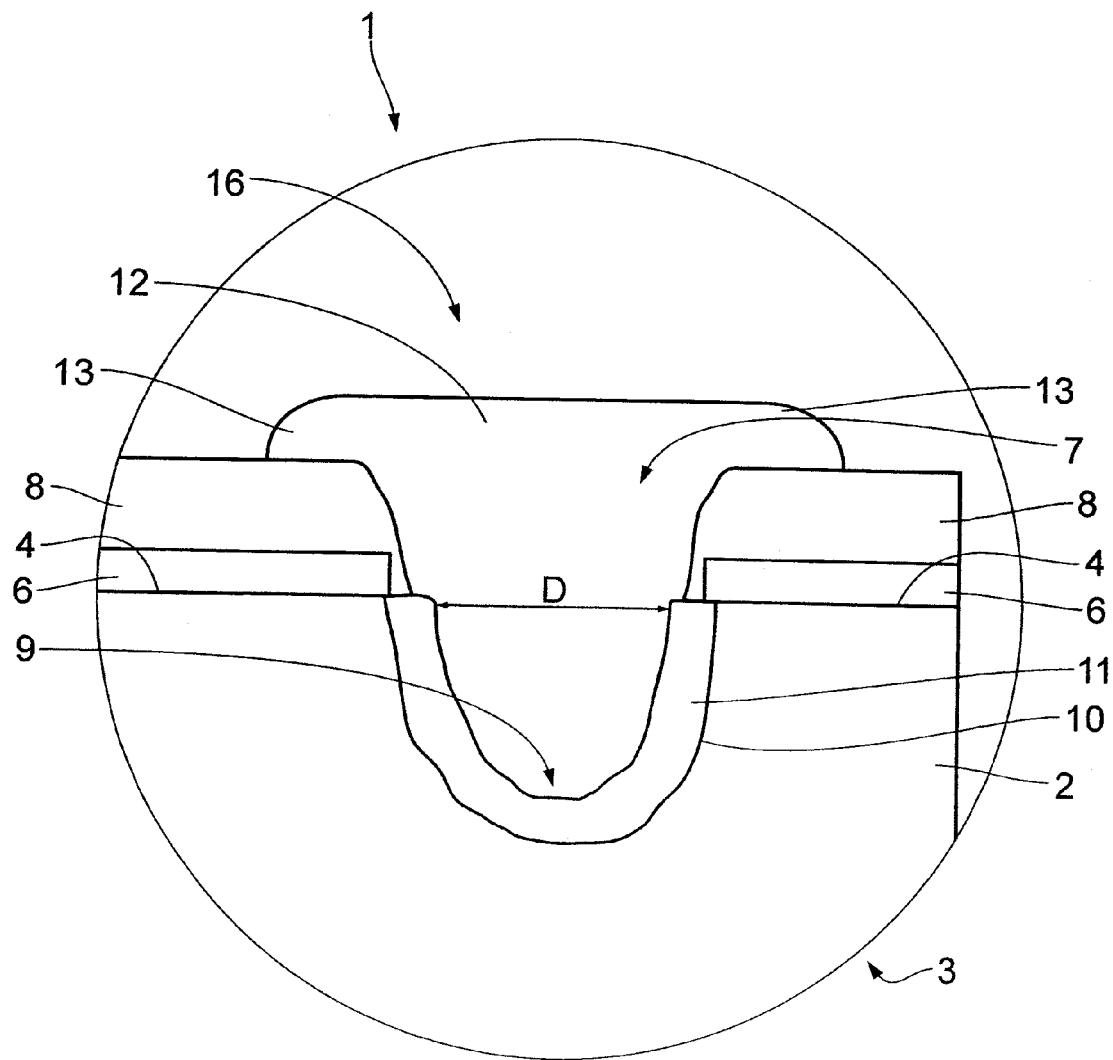
FIG. 4 is an enlarged sectional view of the region IV in FIG. 2.
Figure 5:
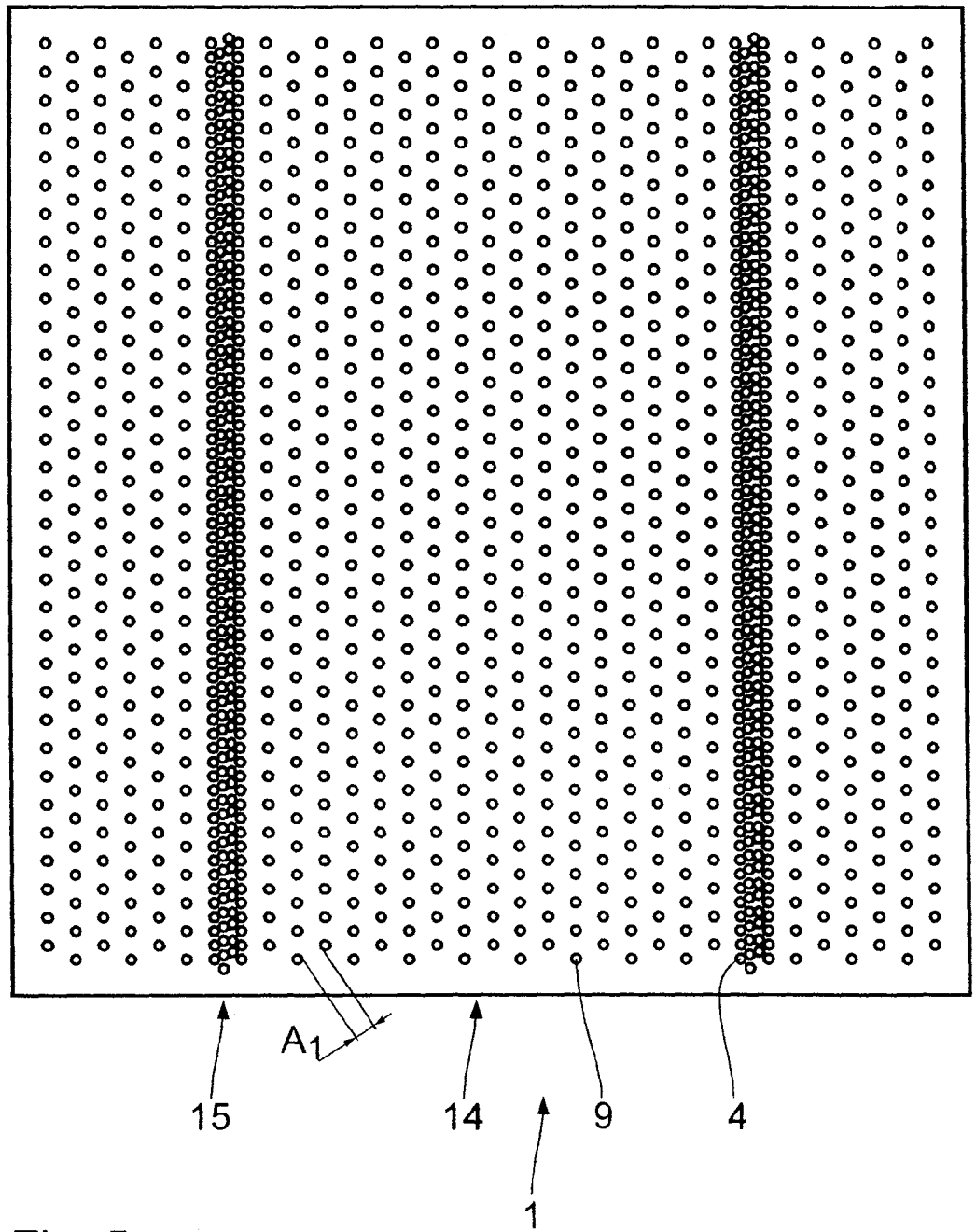
FIG. 5 is a view of the back side of the semiconductor component according to FIG. 1.

A semiconductor component 1, which is in particular configured as a solar cell, comprises a flat, in other words two-dimensional semiconductor substrate 2 with a front side 3, a back side 4 which is opposite to said front side 3, and a surface normal 5 which is perpendicular to the front side 3 and the back side 4. The semiconductor substrate 2 consists of a semiconductor material, in particular of silicon. Other semiconductor materials are however conceivable as well. On the back side 4 of the semiconductor substrate 2 is provided an electric passivation layer 6 which may also be configured as an internal light reflector. The passivation layer 6 is electrically insulating. The passivation layer 6 preferably consists of silicon nitride or silicon dioxide. The passivation layer 6 comprises a plurality of openings 7. The openings 7 have dimensions perpendicular to the surface normal 5 which are very small in relation to the dimensions of the semiconductor substrate 2. They are therefore also referred to as point-shaped. The openings 7 are in particular circular. The openings 7 are formed by laser pulses.

The semiconductor component 1 further comprises an electrically conducting contact layer 8 which is arranged on the passivation layer 6. The contact layer 8 consists of a metal with good electrical conductivity, in particular of aluminum. The contact layer 8 is reflective on its side facing the semiconductor substrate 2.

The openings 7 extend through the entire contact layer 8 and the entire passivation layer 6 arranged therebelow in the direction of the surface normal 5. In the region of these openings 7, the semiconductor substrate 2 comprises recesses 9 which extend in the direction of the surface normal 5.

The recesses 9 have a round, in particular a circular cross-section when seen perpendicular to the surface normal 5. They have a diameter D perpendicular to the surface normal in the range of 1 μm to 100 μm, in particular in the range of 25 μm to 75 μm.

Each of the recesses comprises a bottom wall 10 facing the semiconductor substrate. On said bottom wall 10 is formed a bottom layer 11 which comprises at least a proportion of the material of the contact layer 8 and a proportion of the material of the semiconductor substrate 2. In addition to that, the bottom layer 11 may in particular comprise dopants. The bottom layer 11 is electrically connected with the contact layer 8. The bottom layer 11 is in particular a silicon layer with a high doping concentration of aluminum. The bottom layer 11 advantageously comprises an aluminum metal alloy and/or a silicon metal alloy. The bottom layer 11 therefore has good conductivity. The bottom layer 11 also comprises in particular a proportion of boron.

The semiconductor component 1 further comprises a plurality of contact elements 12 in order to establish an electrical connection between the contact layer 8 and the semiconductor substrate 2. The contact elements 12 have good electrical conductivity. Furthermore, they are easily solderable. The contact elements 12 comprise a proportion of nickel. The nickel content amounts to at least 50%, in particular at least 90%, in particular at least 99%. Furthermore, the contact elements preferably comprise a proportion of boron. Instead of the proportion of boron, another dopant may be provided as well. In the contact region between the contact element 12 and the bottom layer 11, a nickel-silicon alloy, in particular nickel silicide, is formed in the recess 9 in the semiconductor substrate 2. Correspondingly, an aluminum-nickel alloy is formed in the contact region between the contact element 12 and the contact layer 8. This considerably reduces the contact resistance between the semiconductor substrate 2 and the contact structure 16 on the one hand and between the contact structure 16 and the contact layer 8 on the other.

The contact elements 12 are therefore conductively connected with both the semiconductor substrate 2 and the contact layer 8. They fill in each case at least 50%, in particular at least 90%, preferably 100% of the recesses 9. In the direction perpendicular to the surface normal 5, a projection 13 of the contact elements 12 projects in each case beyond the recesses 9. The projection 13 is disposed on the contact layer 8.

The recesses 9 with the contact elements 12 are arranged in a regular pattern on the back side 4 of the semiconductor substrate 2. The pattern comprises at least two portions 14, 15. The second portion 15 is strip-shaped. It comprises at least one, preferably several linear subportions which are parallel to each other. Adjacent recesses 9 in the first portion 14 have a first distance $A_1$ while adjacent recesses 9 in the second portion 15 have a second distance $A_2$. The second distance $A_2$ is smaller than the first distance $A_1$, $A_2<A_1$. The second distance $A_2$ is in the range of 10 µm to 200 µm, in particular in the range of 50 µm to 120 µm, in particular in the range of 80 µm to 100 µm. The second distance $A_2$ is in particular less than twice the size of the projection 13 of the contact elements 12 projecting beyond the recesses 9 in the direction perpendicular to the surface normal 5, with the result that adjacent contact elements 12 in the second portion 15 are in contact with each other via their projections 13, thus forming a coherent contact structure 16. The size of the projection 13 is however not sufficient for the contact structure 16 to cover the semiconductor substrate 2 completely, i.e. without gaps. In other words, there are gaps between the contact elements 12 which are in contact with each other in the second portion 15, the gaps forming cells in the coherent contact structure 16. The contact structure 16 is therefore also referred to as an open-cell structure. These cells considerably improve the mechanical properties of the contact structure 16. The cells allow in particular thermal stresses to be compensated for which occur between the contact structure 16 and the semiconductor substrate 2. The contact structure 16 is linear. It is therefore also referred to as busbar.

In contrast to the second portion 15, the distance $A_1$ between two adjacent contact elements 12 in the first portion 14 is more than twice the size of the projection 13 of the contact elements 12 projecting beyond the recesses 9 in the direction perpendicular to the surface normal 5. In the first portion 14, the individual contact elements 12 are thus electrically insulated from each other. The first distance $A_1$ is in the range of 200 µm to 20000 µm. It amounts preferably to at least 500 µm, in particular to at least 1000 µm.

The recesses 9 with the contact elements 12 are preferably arranged at the corners of a regular, in particular a square, rectangular or hexagonal lattice.

The contact structure 16, i.e. the contact elements 12, of the second portion 15 is soldered to contact strips 18 by means of a solder layer 17. The solder layer 17 may consist of a tin-lead solder or of a lead-free tin solder. The solder of the solder layer advantageously comprises a proportion of bismuth. A more detailed description thereof can be found in DE 10 2008 031 836.1.

It is intended for the semiconductor component 1 to comprise a contact structure on the front side 3 which corresponds to in each case one of the contact structures 16, with the contact structures 16 on the front and back sides 3, 4 being in each case in line with each other in the direction of the surface normal 5.

In an alternative embodiment, the second portion with a closer arrangement of the recesses 9 comprising the contact elements 12 is dispensed with. It is intended instead for the entire surface of the back side 4 of the semiconductor component 1 to be provided with a foil of a well-conductive and soft-solderable material such as copper or a metal alloy such as brass, with the foil being soldered to the contact elements 12. The metal foil is advantageously coated with a tin solder. The contact strips 18 may then be soldered to the surface of said foil, thus allowing several semiconductor components 1 to be combined in one module. The metal foil considerably improves the transverse conductivity of the back side 4 of the LFC solar cell, which may result in a reduced resistance loss and an increased efficiency. The solder contact with contact strips can be dispensed with if a suitably shaped foil is arranged on the front-side busbar of the adjacent solar cell in such a way that the foil establishes the serial connection between the individual solar cells.

The following is a description of a method for the production of the semiconductor component 1. The semiconductor component 1 comprising laser fired (LF) contacts is provided in a first step. A detailed description of the production of the semiconductor component 1 comprising LF contacts can be found in DE 10 2008 024 053.2. The semiconductor substrate 2 is the starting point, with the semiconductor substrate 2 being in particular a silicon wafer of which at least the back side 4, and preferably the front side 3 as well, is provided with the passivation layer 6 and the contact layer 8 disposed thereon. The recesses 9 are then formed in the semiconductor substrate 2 by means of a pulsed laser. When the recesses 9 are formed in the semiconductor substrate 2, the openings 7 form in the contact layer 8 and the passivation layer 6 disposed therebelow. Advantageously, a liquid-jet guided laser is provided for forming the recesses 9. The liquid jet may preferably contain dopants such as phosphorous, arsenic, antimony or also boron, indium, aluminum, gallium or compounds thereof.

In order to fill the recesses 9, the contact elements 12 are deposited into the recesses 9 from a dopant-containing electrolyte. Deposition exclusively occurs in the recesses 9. Due to a spontaneously forming aluminum oxide layer which is not able to conduct electrons, the galvanic metal deposition does not occur on the contact layer 8. The galvanic deposition of the contact elements 12 is continued until the recesses 9 are filled completely and the contact elements 12 project beyond the recesses 9 in the direction perpendicular to the surface normal 5. Due to the special arrangement of the recesses 9 on the back side 4 of the semiconductor substrate 2, the projections 13 of the contact elements 12 grow together in the second portion 15, thus forming the coherent, partially closed, open-cell contact structure 16. Furthermore, possible gaps in the contact between the semiconductor substrate 2 and the contact layer 8 in the region of the openings 7 are bridged when the recesses 9 are filled, which reduces the power loss due to the contact resistance of the laser fired contacts.

The contact elements 12 are easily coatable with solder, thus allowing an excellent solder contact to be established between the contact structure 16 and contact strips 18. In this process, a firm bond is established between the contact strips 18 and the semiconductor component 1. Thermal stresses which may typically occur when soldering the semiconductor substrate 2 and the contact structure 16 due to different expansion coefficients thereof are at least partially compensated for by the cells between the contact elements 12.

In another embodiment, it is intended for the semiconductor component 1 to be tempered after the deposition of the contact elements 12 into the recesses 9. The temperature in this tempering step is in the range between 300° C. and 700° C., in particular in the range between 400° C. and 550° C. When the semiconductor component 1 is tempered, nickel silicide forms in the recesses 9, in particular in the region of the bottom layer 11. Correspondingly, an aluminum nickel alloy forms in the contact region between the projections 13 of the contact elements 12 and the contact layer 8. This considerably reduces the contact resistance between the contact elements 12 and the semiconductor substrate 2 on the one hand and between the contact elements 12 and the contact layer 8 on the other. Furthermore, the tempering process causes aluminum-silicon alloys to form in the bottom layer 11. Finally, the tempering process facilitates the diffusion of a dopant, which may optionally be incorporated in the contact elements 12, through the bottom wall 10 into the semiconductor substrate 2.

Tempering is preferably performed in an inert gas atmosphere. If tempering is alternatively performed in air, it is intended for the solderability of the contact elements 12 to be reestablished by treating the surface thereof with hydrochloric acid. The hydrochloric acid preferably has a concentration of approximately 20%.

Figure 6:
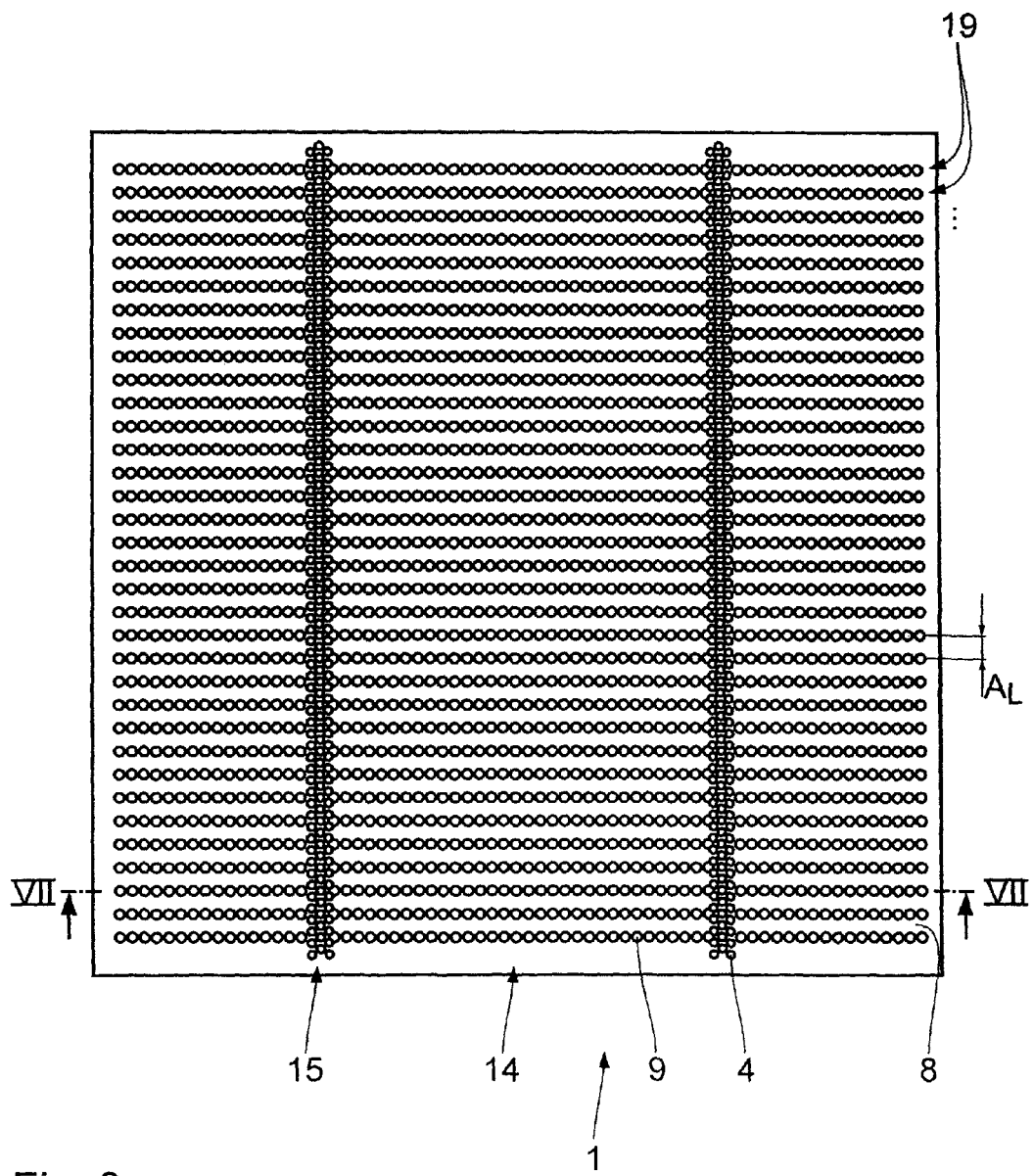
FIG. 6 is a view of the back side of the semiconductor component according to another embodiment.
Figure 7:
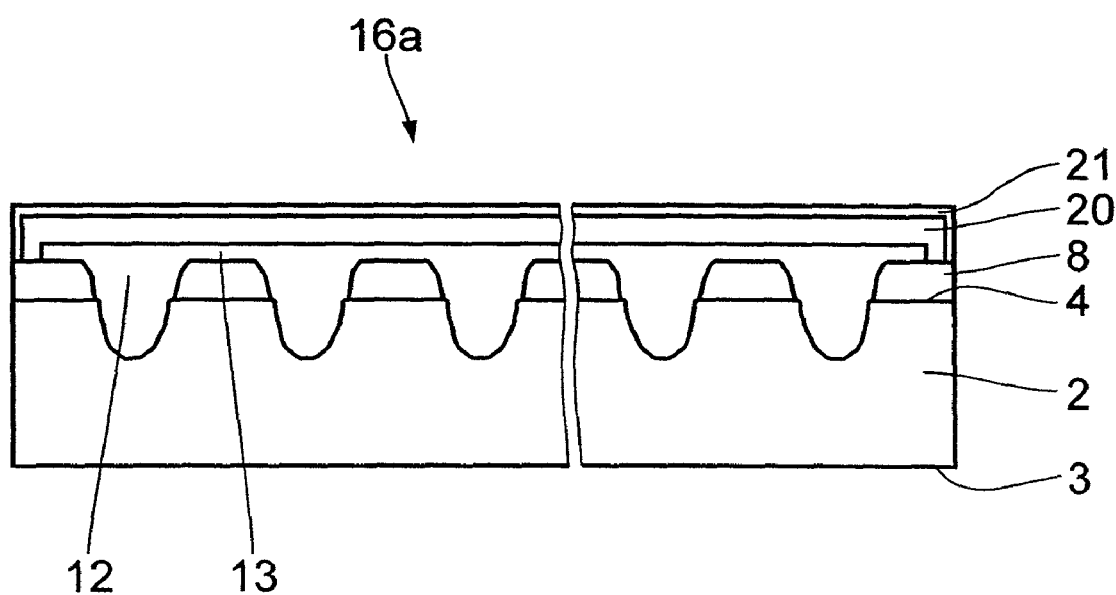
FIG. 7 is a simplified sectional view along the line VII-VII of the embodiment according to FIG. 6.

The following is a description of another embodiment of the invention with reference to FIGS. 6 and 7. Identical components are denoted by the same reference numerals as in the first embodiment to the description thereof reference is made. Differently constructed but functionally identical components are denoted by the same reference numerals with a subsequent a. In this embodiment, the contact elements 12 of the first portion 14 are arranged in lines. The lines extend preferably perpendicular to the orientation of the linear contact structure 16a in the second portion 15, the contact structure 16a forming busbars.

Consequently, the contact structure 16a of this embodiment comprises linear transverse contacts 19 in addition to the busbars in the second portion 15. The transverse contacts 19 are perpendicular to the busbars. The transverse contacts 19 are conductively connected with the busbars. They interconnect the busbars. They are in particular arranged in such a way that they are opposite to contact fingers on the front side 3 of the semiconductor substrate 2 when seen in the direction of the surface normal 5. They are advantageously arranged at a line distance $A_L$ which corresponds to the distance $A_1$ of the first embodiment. The line distance $A_L$ is preferably an integral multiple of the distance of the contact fingers on the front side 3, amounting to in particular twice or three times the distance of said contact fingers. Arranging the linear transverse contacts 19 opposite to the contact fingers on the front side 3 of the semiconductor substrate 2 ensures that recombination losses are kept to a minimum.

The transverse contacts 19 provide the transverse conductivity of the back side 4. This allows the thickness of the contact layer 8 to be reduced, thus resulting in a shorter process time as well as material and cost savings. The contact layer 8 of this embodiment has a thickness $D_K$ which amounts to no more than 0.5 µm, in particular no more than 0.2 µm, in particular no more than 0.1 µm.

The contact elements 12 are formed corresponding to the first embodiment. An additional conductive layer 20 is provided which is deposited on the contact elements 12 so as to improve the conductivity thereof. The conductive layer 20 has a thickness in the range of 3 µm to 50 µm. The thickness of the contact elements 12 is in the range of 1 µm to 5 µm when measured from the back side 4 of the semiconductor substrate 2 in the direction of the surface normal 5. The conductive layer 20 preferably comprises a proportion of copper. The conductive layer 20 in particular consists entirely of copper or a copper compound. The contact elements 12 form a boundary layer in this embodiment which prevents a diffusion of copper ions into the semiconductor substrate 2.

On the conductive layer 20 is provided a solder layer 21. The solder layer 21 has a thickness in the range of 1 µm to 5 µm. It comprises at least a proportion of nickel, silver, tin or of a compound of these metals. It preferably consists of silver, nickel or tin.

The contact structure 16a thus comprises the contact layer 8, the boundary layer, the conductive layer 20 and the solder layer 21. A corresponding design of the contact structure 16a is of course also conceivable in the first embodiment.

The described contact structures may also be used to produce a front side metallization with a high aspect ratio. In this case, the contact layer 8 is removed again from the region between the contact structures 16, 16a after deposition of said contact layer 8. This is for instance performed by means of suitable chemicals, in particular a sodium hydroxide solution.

What is claimed is:
1. A semiconductor component comprising:
a two-dimensional semiconductor substrate having a first side, a second side arranged opposite to said first side, a surface normal which is perpendicular to said first side and said second side and a plurality of recesses which are at least arranged on the second side and extend in a direction of the surface normal;
at least one dielectric passivation layer arranged on the second side;
an electrically conducting contact layer arranged on the passivation layer;
a plurality of contact elements for electrically connecting the contact layer with the semiconductor substrate, said contact elements being electrically conductive, said contact elements being in electrically conducting connection with the semiconductor substrate and the contact layer, said contact elements filling at least 50% of at least one of the recesses, said contact elements projecting beyond the recesses with a projection in a direction perpendicular to the surface normal, said contacts comprising a solderable material, wherein the recesses are arranged in a regular pattern on the second side of the semiconductor substrate, which pattern comprises at least two portions, with adjacent recesses in a first portion having a first distance while adjacent recesses in the second portion have a second distance that is less than said first distance in at least one direction.
2. A semiconductor component according to claim 1, wherein the recesses are arranged at corner points of a regular lattice in at least one of the at least two portions.

3. A semiconductor component according to claim 2, wherein the recesses are arranged at the corner points of a hexagonal lattice in at least one of the at least two portions.

4. A semiconductor component according to claim 1, wherein the first distance is more than twice a size of the projection of the contact elements beyond the recesses in the direction of the surface normal.

5. A semiconductor component according to claim 1, wherein the second distance is less than twice a size of the projection of the contact elements beyond the recesses in the direction perpendicular to the surface normal so that adjacent contact elements are in contact with each other by means of said projections of said adjacent contact elements to form a coherent second contact structure.

6. A semiconductor component according to claim 5, wherein the second contact structure comprises at least one linear busbar.

7. A semiconductor component according to claim 6, wherein the second contact structure comprises linear transverse contacts.

8. A semiconductor component according to claim 7, wherein the linear transverse contacts are arranged perpendicular to the at least one linear busbar.

9. A semiconductor component according to claim 1, wherein the second distance is in a range of 10 µm to 200 µm.

10. A semiconductor component according to claim 9, wherein the second distance is in the range of 50 µm to 120 µm.

11. A semiconductor component according to claim 9, wherein the second distance is in the range of 80 µm to 100 µm.

12. A semiconductor component according to claim 6, wherein on the first side, a contact structure is provided which corresponds to in each case one linear contact structure, the contact structures being in line with each other in the direction of the surface normal.

\* \* \* \* \*